United States Patent
Basceri et al.

(10) Patent No.: US 7,232,721 B2
(45) Date of Patent: Jun. 19, 2007

(54) STRUCTURES AND METHODS FOR ENHANCING CAPACITORS IN INTEGRATED CIRCUITS

(75) Inventors: Cem Basceri, Boise, ID (US); Vishnu K. Agarwal, Boise, ID (US); Dan Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 321 days.

(21) Appl. No.: 10/931,396

(22) Filed: Aug. 31, 2004

(65) Prior Publication Data

US 2005/0032299 A1 Feb. 10, 2005

Related U.S. Application Data

(62) Division of application No. 09/598,355, filed on Jun. 21, 2000, now Pat. No. 7,009,240.

(51) Int. Cl.
*H01L 21/8242* (2006.01)
*H01L 21/20* (2006.01)

(52) U.S. Cl. .................. 438/253; 438/398; 438/240
(58) Field of Classification Search ........ 438/243–254, 438/396–398; 257/295–310
See application file for complete search history.

(56) References Cited

U.S. PATENT DOCUMENTS

| | | | |
|---|---|---|---|
| 5,142,438 A | 8/1992 | Reinberg et al. ............. 361/313 |
| 5,177,570 A | 1/1993 | Tanaka ........................ 257/345 |
| 5,358,889 A | 10/1994 | Emesh et al. ................. 437/60 |
| 5,463,483 A | 10/1995 | Yamazaki ..................... 359/58 |
| 5,622,893 A | 4/1997 | Summerfelt et al. ......... 438/396 |
| 5,702,970 A | 12/1997 | Choi ........................... 438/396 |
| 5,814,539 A | 9/1998 | Nakazawa ................... 438/163 |
| 5,815,427 A | 9/1998 | Cloud et al. .................. 365/51 |
| 5,905,278 A * | 5/1999 | Nakabayashi ............... 257/296 |
| 5,910,880 A | 6/1999 | DeBoer et al. .............. 361/311 |
| 5,969,983 A | 10/1999 | Thakur et al. .............. 365/149 |
| 6,066,540 A | 5/2000 | Yeom et al. ................. 438/396 |
| 6,235,572 B1 | 5/2001 | Kunitomo et al. .......... 438/240 |
| 6,249,040 B1 | 6/2001 | Lin et al. ..................... 257/532 |
| 6,262,450 B1 | 7/2001 | Kotecki et al. .............. 257/306 |
| 6,306,699 B1 | 10/2001 | Matsubara et al. ......... 438/210 |
| 6,545,856 B1 * | 4/2003 | Norga et al. ................. 257/295 |
| 6,627,497 B2 * | 9/2003 | Nakanishi et al. .......... 438/253 |
| 6,686,274 B1 | 2/2004 | Shimazu et al. ............. 438/653 |

OTHER PUBLICATIONS

Aoyama, T., et al., "Ultrathin Ta2O5 Film Capacitor with Ru Bottom Electrode", *Journal of the Electrochemical Society*, 145(8), (1998),2961-2364.

(Continued)

*Primary Examiner*—Cuong Nguyen
(74) *Attorney, Agent, or Firm*—Schwegman, Lundberg, Woessner & Kluth, P.A.

(57) ABSTRACT

Systems, devices, structures, and methods are described that inhibit dielectric degradation at high temperatures. An enhanced capacitor is discussed. The enhanced capacitor includes a first electrode, a dielectric that includes ditantalum pentaoxide, and a second electrode having a compound. The compound includes a first substance and a second substance. The second electrode includes a trace amount of the first substance. The morphology of the semiconductor structure remains stable when the trace amount of the first substance is oxidized during crystallization of the dielectric. In one embodiment, the crystalline structure of the dielectric describes substantially a (001) lattice plane.

25 Claims, 17 Drawing Sheets

OTHER PUBLICATIONS

Kishiro, K., et al., "Structure and Electrical Properties of Thin Ta2O5 Deposited on Metal Electrodes", *Jpn. J. Appl. Phys.*, 37, (1998),pp. 1336-1339.

Lin, J., et al., "Ta2O5 thin films with exceptionally high dielectric constant", *Applied Physics Letters*, (1999),2370-2372.

Nakamura, S., et al., "Embedded DRAM Technology compatible to the 0.13 micrometer high-speed Logics by using Ru pillars in cell capacitor and peripheral vias", *IEDM*, (1998),pp. 1029-1031.

* cited by examiner

US 7,232,721 B2

STRUCTURES AND METHODS FOR ENHANCING CAPACITORS IN INTEGRATED CIRCUITS

This application is a Divisional of U.S. application Ser. No. 09/598,355, filed Jun. 21, 2000, now U.S. Pat. No. 7,009,240, which is incorporated herein by reference.

TECHNICAL FIELD

The technical field relates generally to semiconductor integrated circuits. More particularly, it pertains to capacitors in semiconductor integrated circuits.

BACKGROUND

A capacitor is composed of two layers of a material that is electrically conductive (hereinafter, electrode) brought near to one another and separated by a material that is electrically nonconductive. Suppose the capacitor is connected to a battery with a certain voltage level (hereinafter, energy level). Charges will flow from the battery to be stored in the capacitor until the capacitor exhibits the energy level of the battery. Then, suppose further that the capacitor is disconnected from the battery. The capacitor will indefinitely exhibit the energy level of the battery until the charges stored in the capacitor are removed either by design or by accident.

This ability of the capacitor to "remember" an energy level is valuable to the operation of semiconductor integrated circuits. Often, the operation of such circuits may require that data be stored and retrieved as desired. Because of its ability to remember, the capacitor is a major component of a semiconductor memory cell. One memory cell may store one bit of data. A system of memory cells is a semiconductor memory array where information can be randomly stored or retrieved from each memory cell. Such a system is also known as a random-access memory.

One type of random-access memory is dynamic random-access memory (DRAM). The charges stored in DRAM tend to leak away over a short time. It is thus necessary to periodically refresh the charges stored in the DRAM by the use of additional circuitry. Even with the refresh burden, DRAM is a popular type of memory because it can occupy a very small space on a semiconductor surface. This is desirable because of the need to maximize storage capacity on the limited surface area of an integrated circuit One type of capacitor that supports an increase in storage capacity uses a metal substance as a bottom electrode and an electrically nonconductive material that has a high dielectric constant. The metal substance tends to create undesired atomic diffusion in an environment with a high temperature. Such a high temperature, however, is needed to further process the electrically nonconductive material. The undesired atomic diffusion may act to degrade the electrically nonconductive material. That act compromises the ability of the capacitor to maintain the charges. This is detrimental to the storage ability of the capacitor and would render such a memory cell defective.

Thus, what is needed are systems, devices, structures, and methods to inhibit the described effect so as to enhance capacitors with a high dielectric constant in manufacturing environments exhibiting high temperatures.

SUMMARY

The above-mentioned problems with capacitors as well as other problems are addressed by the present invention and will be understood by reading and studying the following specification. Systems, devices, structures, and methods are described which accord these benefits.

An illustrative embodiment includes a capacitor. The capacitor includes a first electrode, a dielectric having a first compound, and a second electrode having a second compound that includes a third and a fourth substance. The first compound of the dielectric includes a first substance and a second substance. The first compound includes ditantalum pentaoxide. The second electrode also contains a trace amount of the third substance. The second compound in an as-deposited state includes a substantial amount of the fourth substance. The trace amount of the third substance is oxidized during the crystallization of the dielectric such that a diffusion of at least one of the first substance and the second substance is inhibited. The crystalline structure of the dielectric describes substantially a (001) lattice plane. The second compound includes $RuO_x$. The x is indicative of a desired number of atoms.

Another illustrative embodiment includes a method for enhancing a semiconductor structure that stores charges. The method includes forming a conductive layer of $RuO_x$, crystallizing to form $RuO_2$ and a trace amount of Ru, forming an amorphous insulator layer of $Ta_2O_5$, and forming a crystallized $Ta_2O_5$ with a desired lattice plane such that the permittivity of the crystallized $Ta_2O_5$ is greater than about 25.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
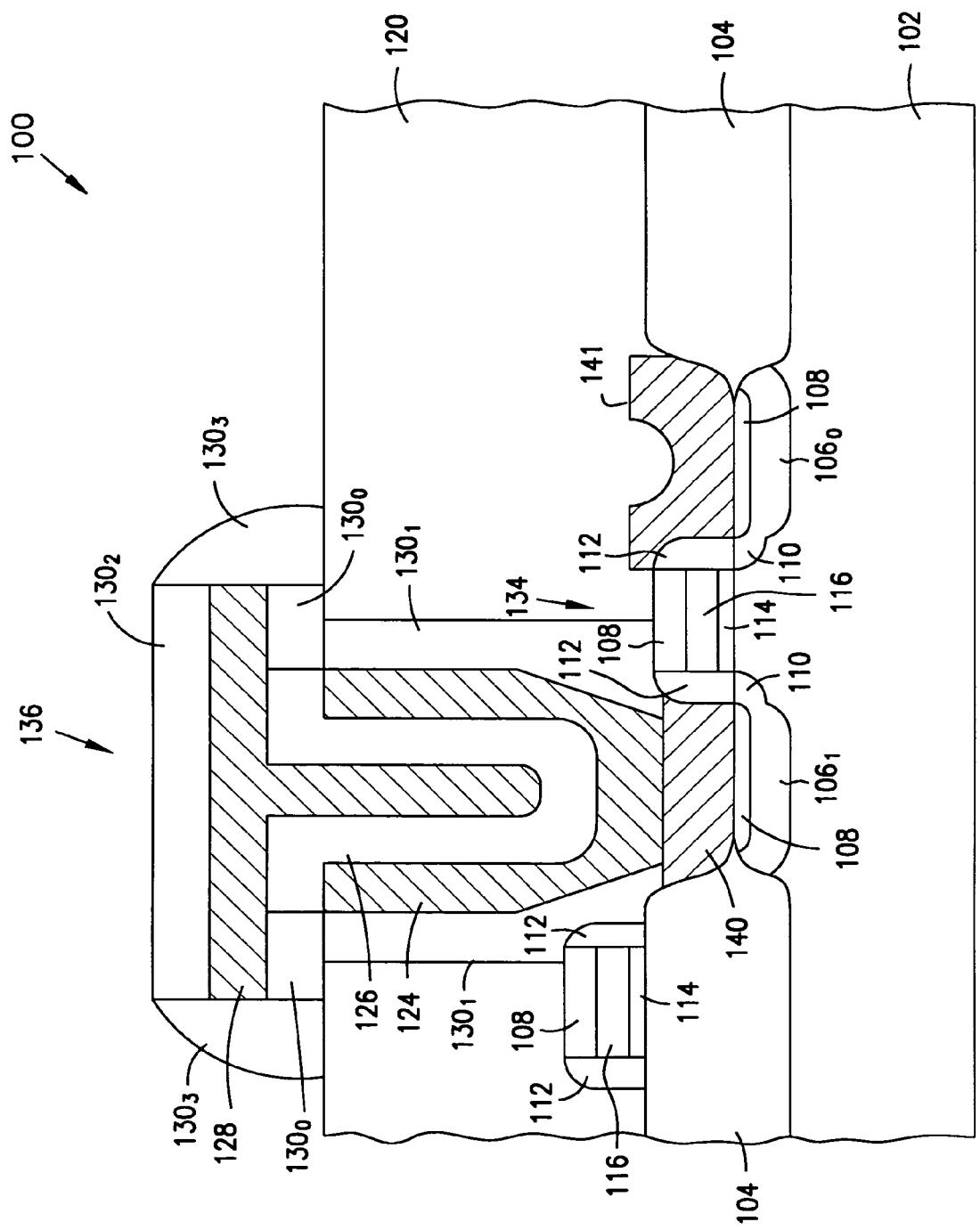
FIG. 1 is a cross-sectional view of a semiconductor structure according to one embodiment of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and any layer that may have been formed above. The following detailed description is, therefore, not to be taken in a limiting sense, and the scope of the present invention is defined only by the appended claims.

FIG. 1 is a cross-sectional view of a semiconductor structure according to one embodiment of the present invention. The semiconductor structure 100 may illustrate an example of a single DRAM cell. The semiconductor structure 100 includes a substrate 102, field isolators 104, transistor 134, insulation layers 120, another semiconductor structure such as a capacitor 136, and a metallization layer 140. In one embodiment, the metallization layer 140 may be considered a conductive plug. In another embodiment, the conductive plug includes polysilicon. The transistor 134 includes source/drain regions $106_0$ and $106_1$, silicide region 108, spacers 112, gate oxide 114, and gate 116. The source/drain regions $106_0$ and $106_1$ include lightly doped source/drain regions 110. The capacitor 136 includes an electrode 124, a dielectric layer 126, and another electrode 128. The dielectric layer 126 is coupled to the electrodes 124 and 128.

Charges can be transferred into or removed from the capacitor 136 by turning on the transistor 134. The transistor 134 is turned on by an appropriate voltage level and polarity placed at the gate 116 so that a depletion region and conducting channel are formed between the source/drain regions $106_0$ and $106_1$. If charges are to be transferred into the capacitor 136, these charges are introduced at the source/drain region $106_0$ by a buried bit line 141, so that they may travel across the conducting channel into the source/drain region $106_1$, conduct through the metallization layer 140, and enter the electrode 124. The charges cannot go any further because the dielectric layer 126 is electrically nonconductive. However, these charges will attract opposite polarity charges to appear at electrode 128. Hence, an electric field is set up between the electrodes 124 and 128. Energy is stored in this electric field. This electric field is the phenomenon that allows the capacitor to "remember."

There exists an industry-wide drive to smaller memory cells to increase storage density on the limited surface area of an integrated circuit. This has motivated the use of a thin film nonconductive material for use as a dielectric 126 of the capacitor 136. High temperatures may be used in the processing of the semiconductor structure 100. Such high temperatures may cause the bottom electrode 124 to undesirably act with a portion of the semiconductor structure 100, such as the dielectric 126 of the capacitor 136. Such action may degrade the properties of the dielectric 126 to cause the capacitor 136 to become defective over time.

One example of the degradation of the dielectric 126 includes the use of a metal substance for the bottom electrode 124. A high temperature (about 750 degrees Celsius or greater) is used to crystallize the dielectric 126. At such a high temperature, thermal vibration in the crystal structure of the metal substance increases, thereby increasing the likelihood of structural disruption. Such a structural disruption introduces point defects, such as vacancies in the crystal structure of the metal substance. Suppose that the dielectric 126 includes a compound comprising another metal substance and nonmetal atoms. Under the environment as described above, nonmetal atoms of the dielectric 126 may diffuse to fill the point defects in the crystal structure of the metal substance of the bottom electrode 124. Such a diffusion may short-circuit the capacitor 136. This may occur because the metal substance of the dielectric 126 in the absence of the nonmetal atoms may conductively couple the electrode 124 to the electrode 128.

One solution includes using lower temperatures (750 degrees Celsius or lower) to crystallize the dielectric 126. However, at such temperatures, the dielectric 126 tends to exhibit high leakage values. This may be attributed to insufficient incorporation of the nonmetal atoms with the metal atoms in the crystal structure of the dielectric 126 at low temperatures. Thus, this solution is inadequate.

The embodiments of the present invention solve the above-discussed problem while enhancing the dielectric 126. In one embodiment, a semiconductor structure for storing charges includes an insulator layer having a first compound that includes substances, and a conductive layer having a second compound that includes a first substance and a second substance. The second compound in an as-deposited state includes a substantial amount of the second substance so as to inhibit undesired diffusion of at least one substance of the first compound from the insulator layer.

In another embodiment, the semiconductor structure includes an insulator layer and a conductive layer having a compound formed from a first substance and a second substance; the conductive layer includes a trace amount of the first substance. The morphology of the semiconductor structure remains stable when the trace amount of the first substance is oxidized during crystallization of the insulator layer.

In another embodiment, the semiconductor structure includes an insulator layer having a permittivity value greater than about 25, and a conductive layer having a compound. The compound remains stable when the insulator layer is crystallized at a high temperature so as to decrease the charge leakage of the insulator layer. In one embodiment, the insulator layer passivates the conductive layer from undesired oxidation.

In another embodiment, the semiconductor structure includes an insulator layer having a permittivity value, and a conductive layer abuttingly coupled to the insulator layer. The crystalline structure of the insulator layer describes a desired lattice plane such that the permittivity value of the insulator layer is greater than about 25. The desired lattice plane includes substantially a (001) plane. In another embodiment, the desired lattice plane is described by three axes; the desired plane is parallel to two of the three axes and intersects one of the three axes.

In another embodiment, the capacitor 136 includes a first electrode, a dielectric that includes ditantalum pentaoxide, and a second electrode having a compound that includes a first substance and a second substance. The compound in an as-deposited state includes a substantial amount of the second substance so as to inhibit undesired diffusion at a high temperature. The compound includes ruthenium oxide (RuO$_x$). The x is indicative of a desired number of atoms.

In another embodiment, the capacitor 136 includes a first electrode, a dielectric that includes ditantalum pentaoxide, and a second electrode having a compound that includes a first substance and a second substance. The second electrode includes a trace amount of the first substance. The morphology of the semiconductor structure remains stable when the trace amount of the first substance is oxidized during crystallization of the dielectric. The compound includes RuOx. The x is indicative of a desired number of atoms.

In another embodiment, the capacitor 136 includes a first electrode, a dielectric that includes ditantalum pentaoxide, and a second electrode having a compound. The crystalline structure of the dielectric describes a (001) lattice plane. The compound includes RuOx. The x is indicative of a desired number of atoms.

In another embodiment, the capacitor 136 includes a first electrode, a dielectric having a first compound that includes a first substance and a second substance, and a second electrode having a second compound that includes a third and a fourth substance. The first compound includes ditantalum pentaoxide. The second electrode includes a trace amount of the third substance. The second compound in an as-deposited state includes a substantial amount of the fourth substance. The trace amount of the third substance is oxidized during the crystallization of the dielectric such that a diffusion of at least one of the first substance and the second substance is inhibited. The crystalline structure of the dielectric describes substantially a (001) lattice plane. The compound includes RuOx. The x is indicative of a desired number of atoms.

In another embodiment, the capacitor 136 includes a first electrode, a dielectric having a first compound that includes a first substance and a second substance, and a second electrode having a second compound that includes a third substance and a fourth substance. The first electrode has a substance that is selected from a group consisting of TiN, TiON, WN$_x$, TaN, Ta, Pt, Pt—Rh, Pt—RhO$_x$, Ru, RuO$_x$, Ir, IrO$_x$, Pt—Ru, Pt—RuO$_x$, Pt—Ir, Pt—IrO$_x$, SrRuO$_3$, Au, Pd, Al, Mo, Ag, and Poly-Si. The first compound includes ditantalum pentaoxide. The second electrode includes a trace amount of the third substance. The second compound in an as-deposited state includes a substantial amount of the fourth substance. The trace amount of the third substance is oxidized during the crystallization of the dielectric such that a diffusion of at least one of the first substance and the second substance is inhibited. The crystalline structure of the dielectric describes substantially a (001) lattice plane. The second compound includes RuO$_x$, wherein the x is indicative of a desired number of atoms.

Figure 2:
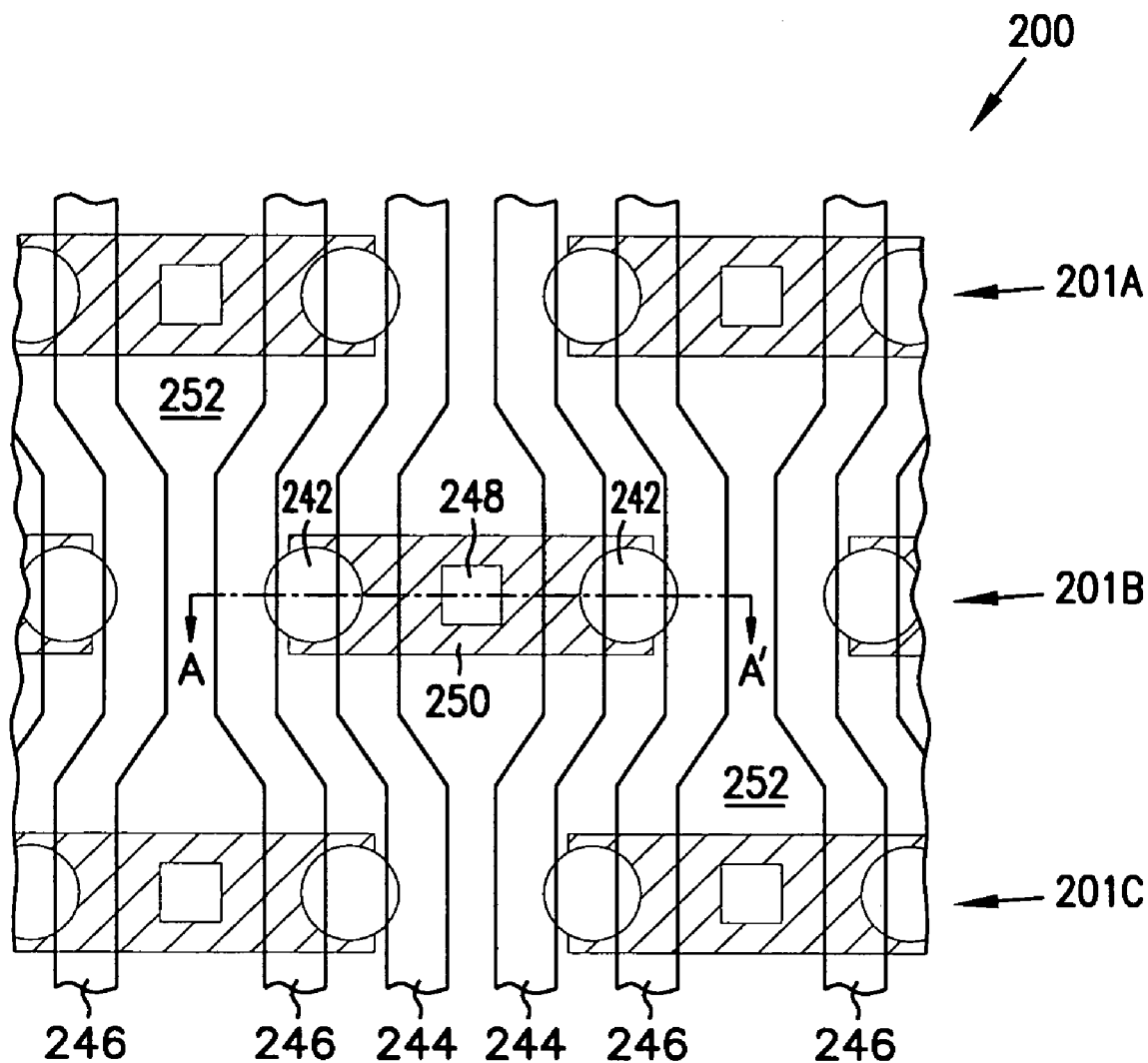
FIG. 2 is an elevation view of a semiconductor memory array according to one embodiment of the present invention.

FIG. 2 is an elevation view of a semiconductor memory array according to one embodiment of the present invention. The memory array 200 includes memory cell regions 242 formed overlying active areas 250. Active areas 250 are separated by field isolation regions 252. Active areas 250 and field isolation regions 252 are formed overlying a semiconductor substrate.

The memory cell regions 242 are arrayed substantially in rows and columns. Shown in FIG. 2 are portions of three rows 201A, 201B and 201C. Separate digit lines (not shown) would be formed overlying each row 201 and coupled to active areas 250 through digit line contact regions 248. Word line regions 244 and 246 are further coupled to active areas 250, with word line regions 244 coupled to active areas 250 in row 201B and word line regions 246 coupled to active areas 250 in rows 201A and 201C. The word line regions 244 and 246, coupled to memory cells in this alternating fashion, generally define the columns of the memory array. This folded bit-line architecture is well known in the art for permitting higher densification of memory cell regions 242.

FIGS. 3A–3K are cross-sectional views of a semiconductor structure during processing according to one embodiment of the present invention. FIGS. 3A–3K are cross-sectional views taken along line A-AN of FIG. 2 during various processing stages.

Semiconductor structure 300 includes a substrate 302. The substrate 302 may be a silicon substrate, such as a p-type silicon substrate. Field isolators 304 are formed over field isolation regions 352 of the substrate 302. Field isolators 304 are generally formed of an insulator material, such as silicon oxides, silicon nitrides, or silicon oxynitrides. In this embodiment, field isolators 304 are formed of silicon dioxide such as by conventional local oxidation of silicon which creates substantially planar regions of oxide on the substrate surface. Active area 350 is an area not covered by the field isolators 304 on the substrate 302. The creation of the field isolators 304 is preceded or followed by the formation of a gate dielectric layer 314. In this embodiment, gate dielectric layer 314 is a thermally grown silicon dioxide, but other insulator materials may be used as described herein.

The creation of the field isolators 304 and gate dielectric layer 314 is followed by the formation of a conductively doped gate layer 316, silicide layer 308, and gate spacers 312. These layers and spacers are formed by methods well known in the art. The foregoing layers are patterned to form word lines in word line regions 344 and 346. A portion of these word lines is illustratively represented by gates $338_0$, $338_1$, $338_2$, and $338_3$. In one embodiment, the silicide layer 308 includes a refractory metal layer over the conductively doped gate layer 316, such as a polysilicon layer.

Source/drain regions 306 are formed on the substrate 302 such as by conductive doping of the substrate. Source/drain regions 306 have a conductivity opposite the substrate 302. For a p-type substrate, source/drain regions 306 would have an n-type conductivity. The source/drain regions 306 include lightly doped source/drain regions 310 that are formed by implanting a low-dose substance, such as an n-type or p-type material. Such lightly doped source/drain regions 310 help to reduce high field in the source/drain junctions of a small-geometry semiconductor structure, such as semiconductor structure 300. In one embodiment, each of the gates $338_0$, $338_1$, $338_2$, and $338_3$ is enclosed by a nitride compound layer. The nitride compound layer includes a molecular formula of $Si_xN_y$. The variables x and y are indicative of a desired number of atoms. The portion of the word lines that are illustratively represented by gates $338_0$, $338_1$, $338_2$, and $338_3$ is adapted to be coupled to periphery contacts (not shown). The periphery contacts are located at the end of a memory array and are adapted for electrical communication with external circuitry.

The foregoing discussion is illustrative of one example of a portion of a fabrication process to be used in conjunction with the various embodiments of the invention. Other methods of fabrication are also feasible and perhaps equally viable. For clarity purposes, many of the reference numbers are eliminated from subsequent drawings so as to focus on the portion of interest of the semiconductor structure 300.

Figure 3A:
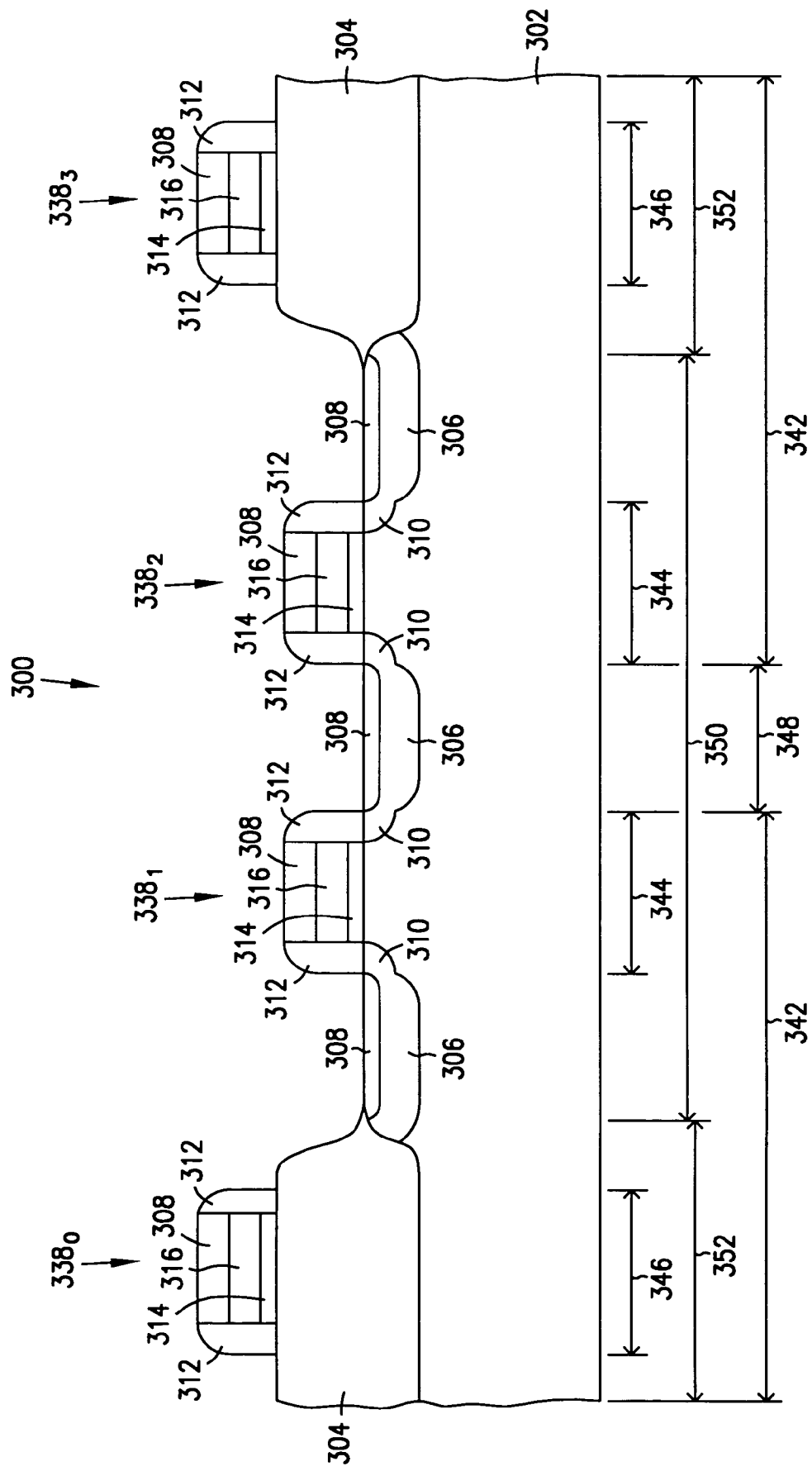
FIGS. 3A–3K are cross-sectional views of a semiconductor structure during processing according to one embodiment of the present invention.
Figure 3B:
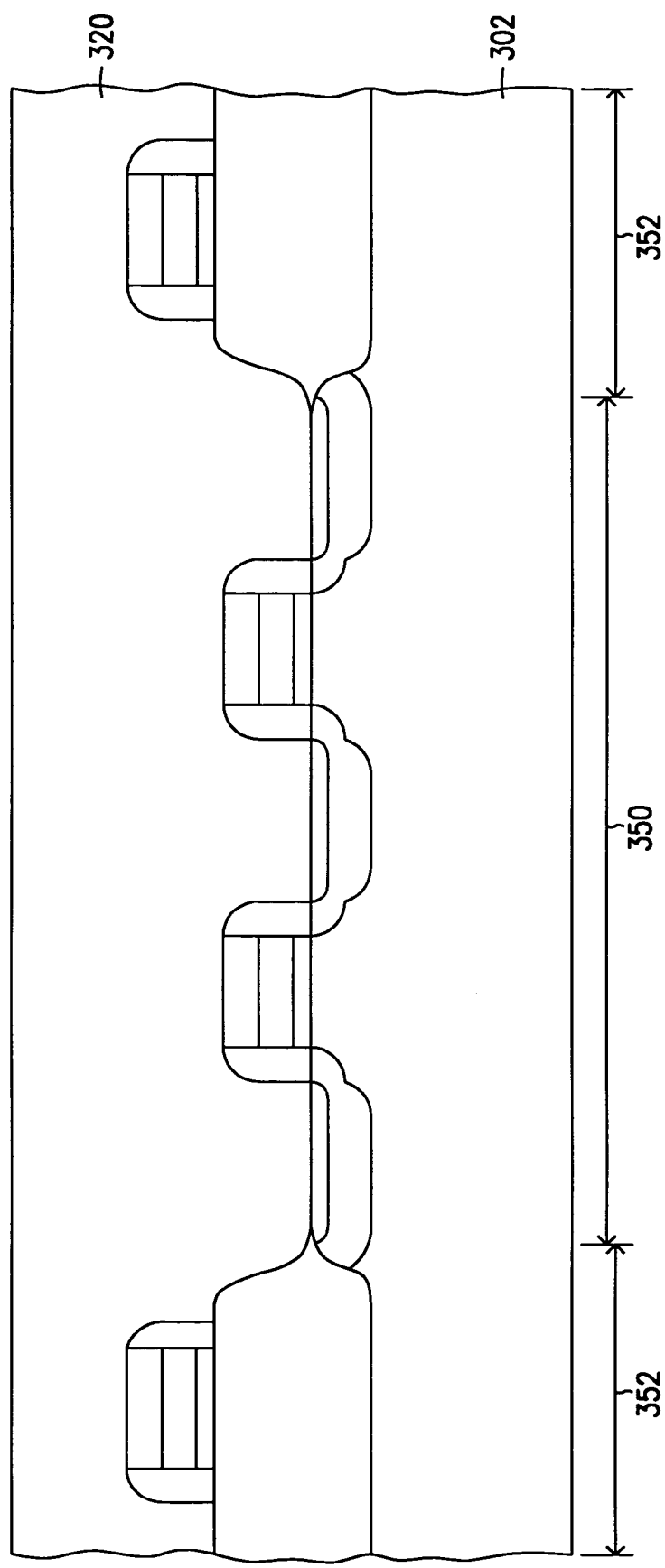

FIG. 3B shows the semiconductor structure following the next sequence of processing. A thick insulation layer 320 is deposited overlying substrate 302 as well as field isolation regions 352 and active regions 350. Insulation layer 320 is an insulator material such as silicon oxide, silicon nitride, and silicon oxynitride. In one embodiment, insulation layer 320 is a doped insulator material such as borophosphosilicate glass (BPSG), a boron and phosphorous-doped silicon oxide. The insulation layer 320 is planarized, such as by chemical-mechanical planarization (CMP), in order to provide a uniform height.

Figure 3C:
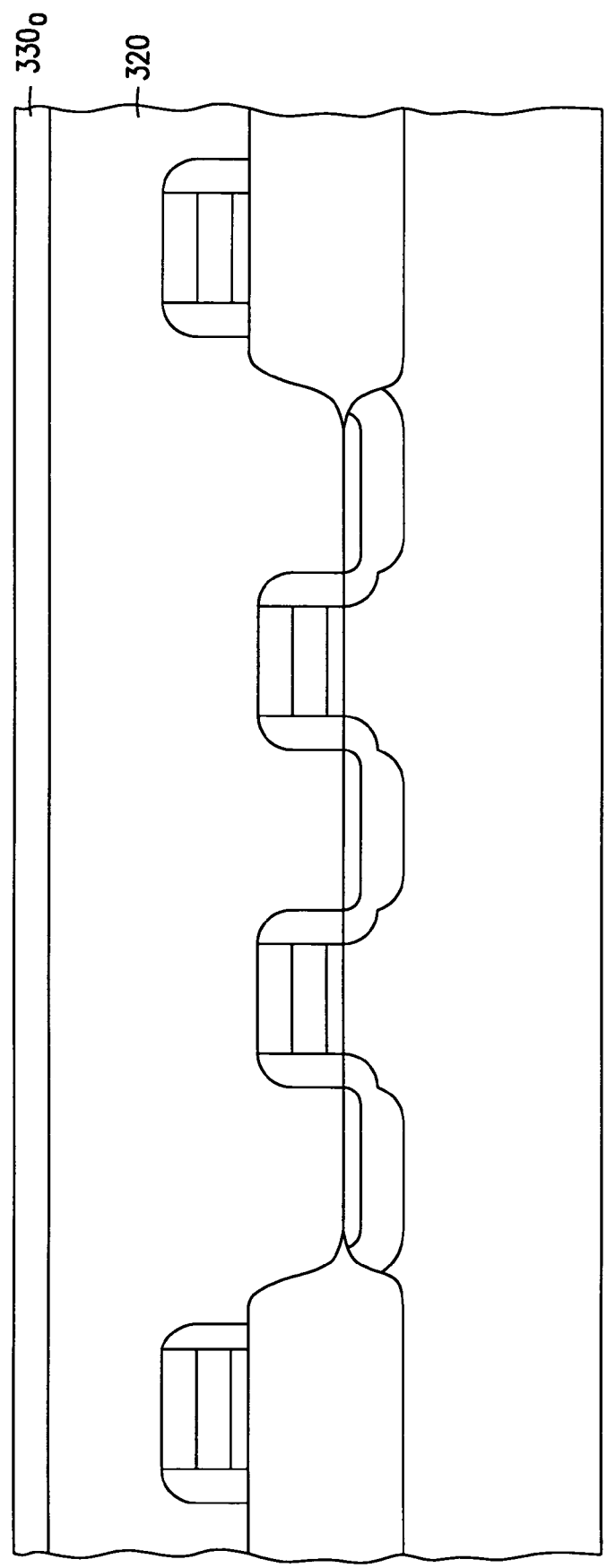

FIG. 3C shows the semiconductor structure following the next sequence of processing. The first inhibiting layer $330_0$ is optionally formed on or abutting the insulation layer 320. The first inhibiting layer $330_0$ includes a nitride compound. In one embodiment, the first inhibiting layer $330_0$ includes a metal nitride compound. The nitride compound includes a substance with a molecular formula of $Si_xN_y$. The variables x and y are indicative of the desired number of atoms.

The first inhibiting layer $330_0$ may be formed by any method, such as collimated sputtering, chemical vapor deposition (CVD), or other deposition techniques. In this embodiment, the first inhibiting layer $330_0$ is patterned to form the first inhibiting layer of a semiconductor structure of interest, such as a capacitor.

Figure 3D:
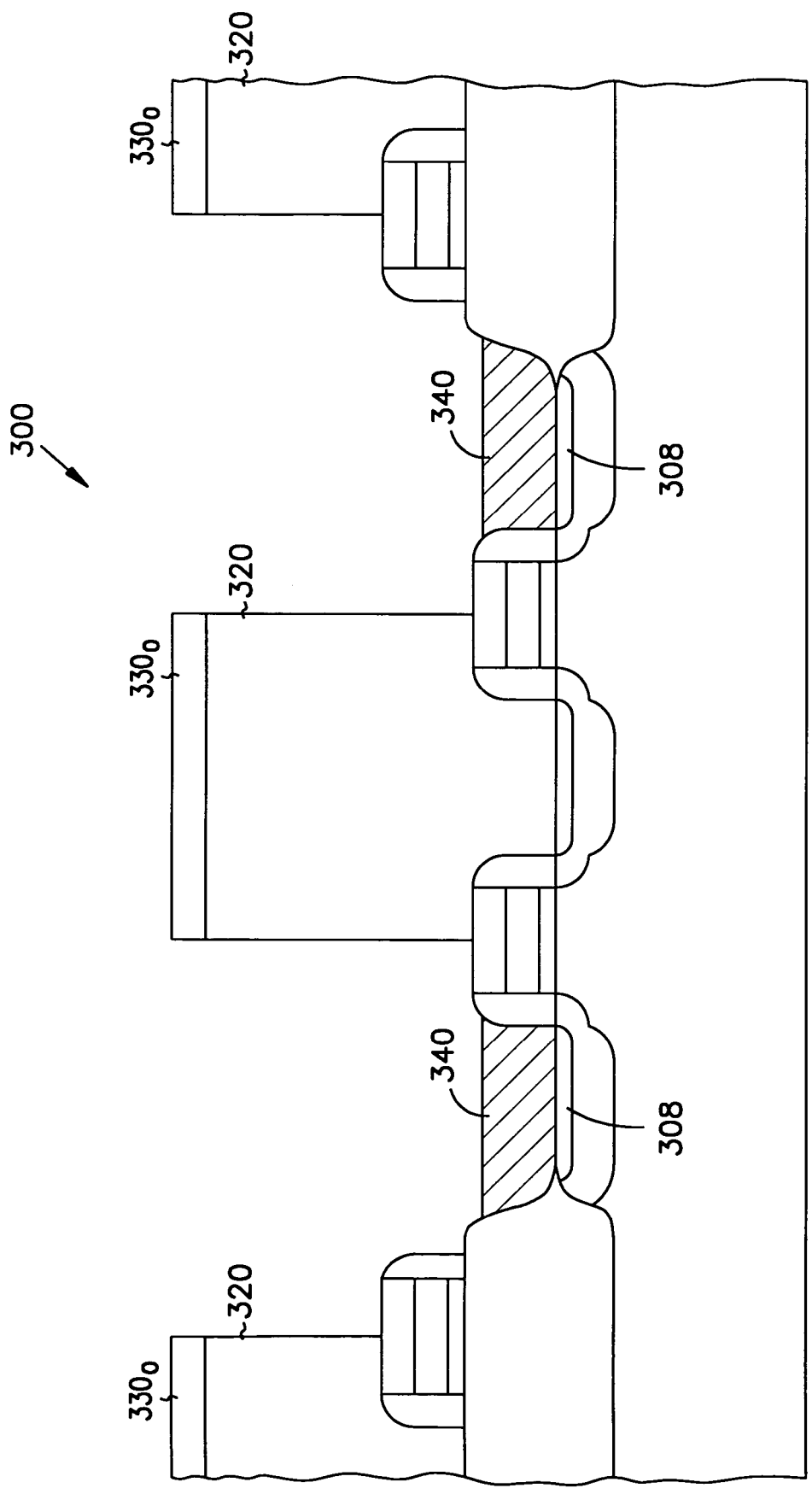

FIG. 3D shows the semiconductor structure following the next sequence of processing. The semiconductor structure 300 is patterned using photolithography with appropriately placed masks to define future locations of memory cells. Then portions of the first inhibiting layer $330_0$ and the insulation layer 320 are exposed and removed along with the masks. These portions of the first inhibiting layer $330_0$ and the insulation layer 320 may be removed by etching or other suitable removal techniques known in the art. Removal techniques are generally dependent on the material of construction of the layer to be removed as well as the surrounding layers to be retained. Patterning of the first inhibiting layer $330_0$ and the insulation layer 320 creates openings having bottom portions exposed to portions of the silicide region 308 and sidewalls defined by the insulation layer 320. A metallization layer 340 is formed on the silicide region 308 using a suitable deposition technique. In one embodiment, the metallization layer 340 may be considered a conductive plug. In another embodiment, the conductive plug includes conductive polysilicon.

Figure 3E:
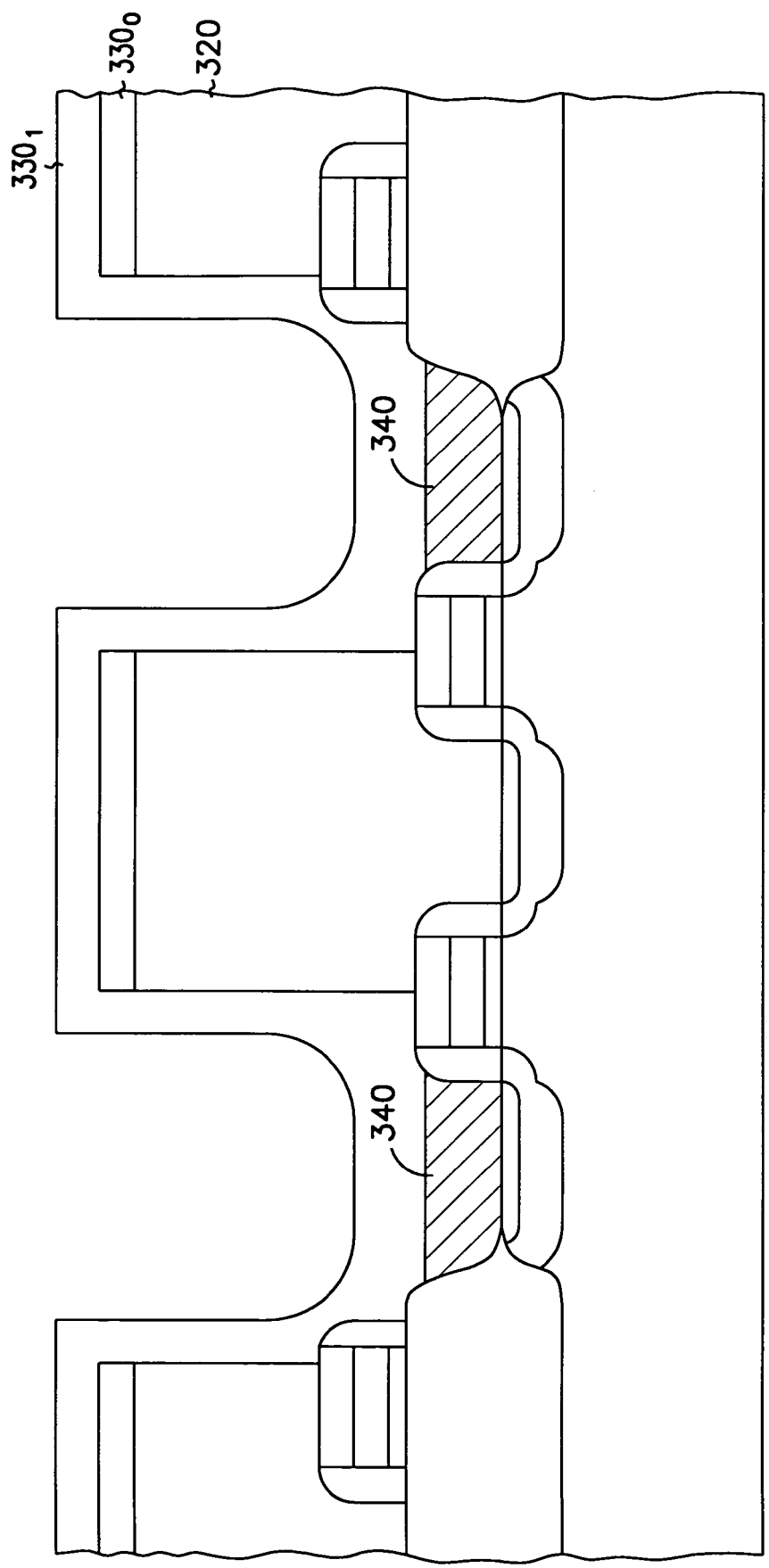

FIG. 3E shows the semiconductor structure following the next sequence of processing. A second inhibiting layer $330_1$ is optionally formed on the first inhibiting layer $330_0$, the insulation layer 320, and the metallization layer 340. The second inhibiting layer $330_1$ includes a nitride compound. In one embodiment, the second inhibiting layer $330_1$ includes a metal nitride compound. The nitride compound includes a substance with a molecular formula of $Si_xN_y$. The variables x and y are indicative of the desired number of atoms. The second inhibiting layer $330_1$ may be formed by any method, such as collimated sputtering, chemical vapor deposition (CVD), or other deposition techniques.

Figure 3F:
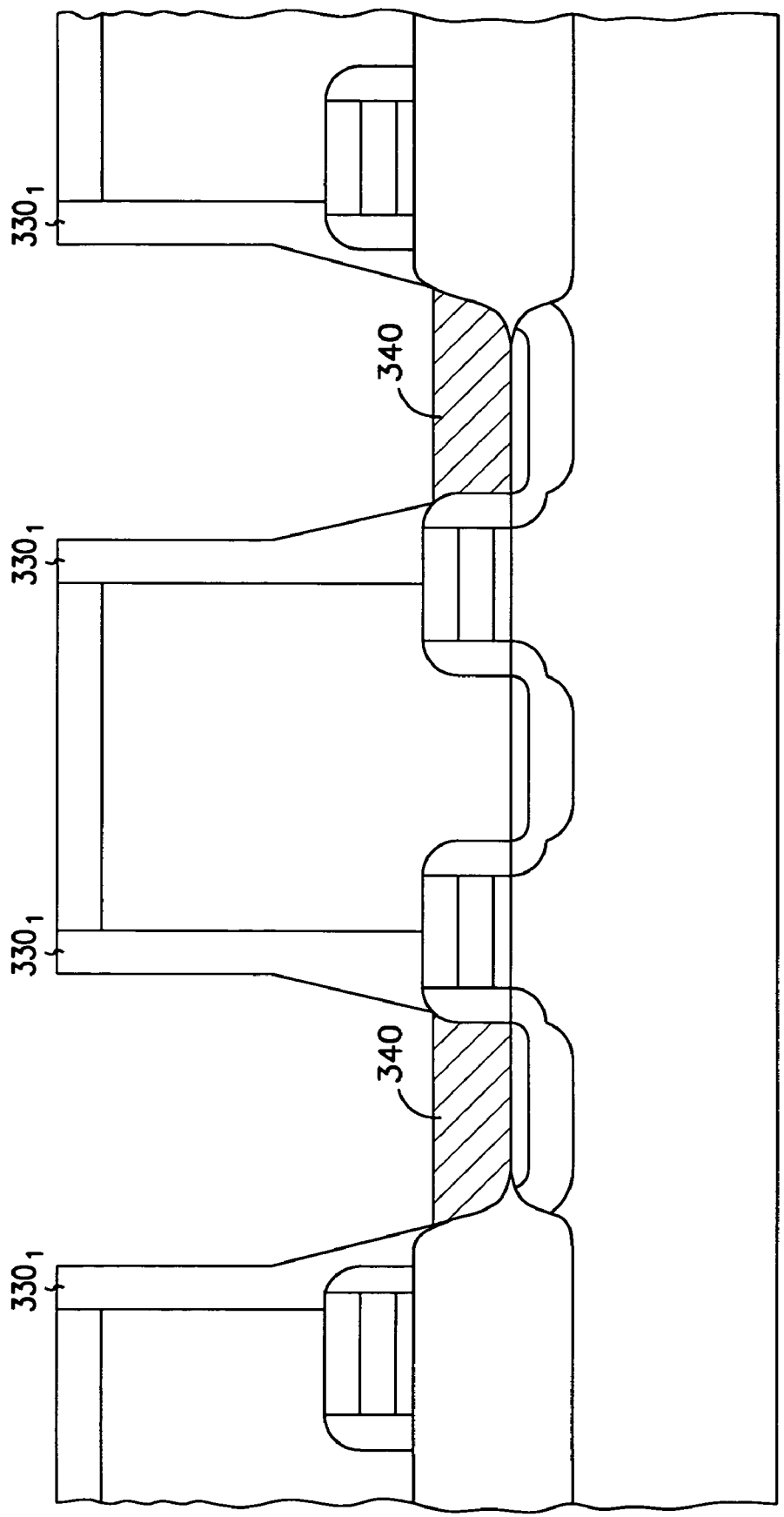

FIG. 3F shows the semiconductor structure following the next sequence of processing. In one embodiment, the second inhibiting layer $330_1$ is etched to define a chamber with an aperture that adjoins the metallization layer 340 and two sidewalls extending outwardly from the aperture. In one embodiment, the etching technique is selected from a group consisting of a spacer etching technique and an etch-back technique.

Figure 3G:
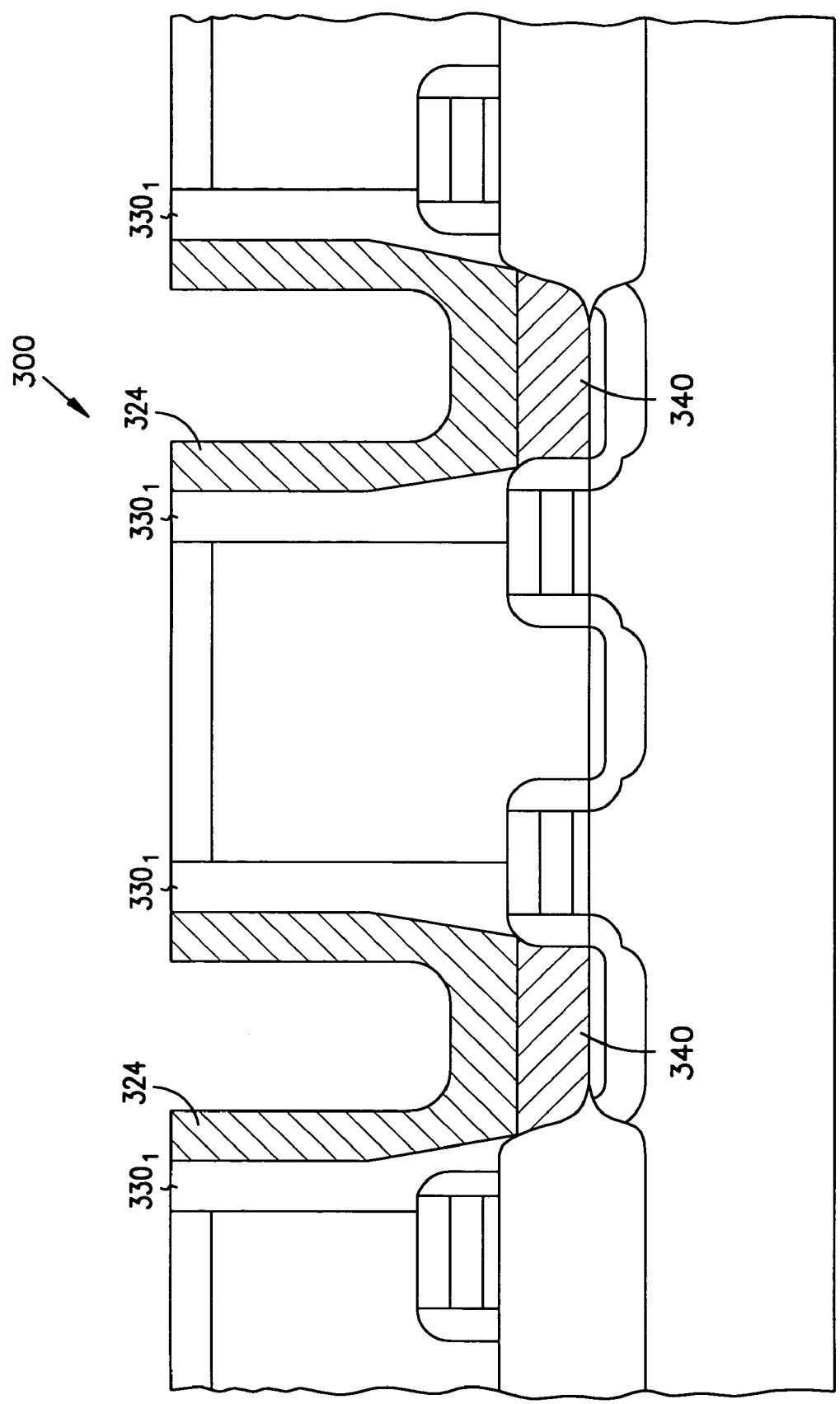

FIG. 3G shows the semiconductor structure following the next sequence of processing. A conductive layer 324 is formed on or adjoining to the inhibiting layer $330_0$, the insulation layer 320 and the metallization layer 340. The conductive layer 324 includes a conductive material. In one embodiment, the conductive material includes an as-deposited film of a conductive compound. The conductive compound includes a first substance and a substantial amount of a second substance. The first substance includes ruthenium. The second substance includes oxygen. The conductive compound includes $RuO_x$. The x is indicative of a desired number of atoms.

The conductive layer 324 may be formed by any method, such as collimated sputtering, chemical vapor deposition (CVD), or other deposition techniques. In this embodiment, the conductive layer 324 forms the bottom conductive layer, or bottom electrode, or bottom plate of a semiconductor structure of interest, such as a capacitor.

In one embodiment, the conductive layer 324 is formed in about 210 degrees Celsius. In another embodiment, the first substance includes about 200 sccm of Ru-HEC. In another embodiment, the second substance includes about 250 sccm of $O_2$. In another embodiment, the conductive layer 324 is formed in about 2.5 torrs.

After the formation of the conductive layer 324, in one embodiment, the conductive layer 324 undergoes an act of crystallizing to form a crystallized film. In one embodiment, the act of crystallizing occurs at a temperature that is greater than about 750 degrees Celsius and less than about 800 degrees Celsius. In another embodiment, the act of crystallizing occurs in an ambient of nitrogen. In another embodiment, the act of crystallizing results in compounds and substances that include ruthenium dioxide and a trace amount of ruthenium.

The conductive layer 324 may undergo a localizing or a polishing process such as by a chemical mechanical planarization technique or other suitable techniques. Such a localizing technique disposes the conductive layer 324 to adjoin the metallization layer 340. In another embodiment, the conductive layer 324 undergoes an etching process such as by a wet etch technique or a dry etch technique. The result is as shown in FIG. 3G.

Figure 3H:
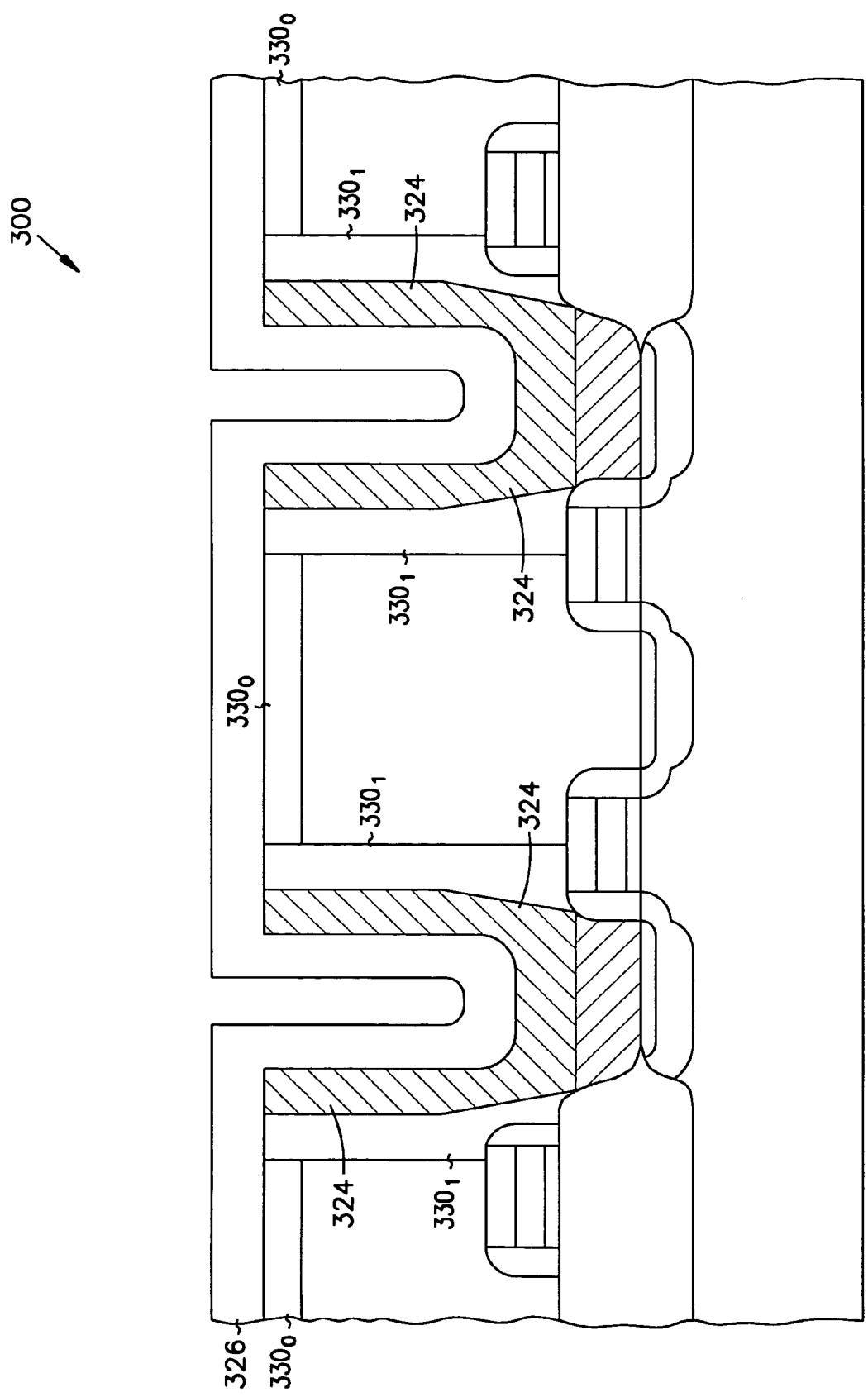

FIG. 3H shows the semiconductor structure following the next sequence of processing. An insulator layer (or dielectric layer) 326 is formed on or adjoining the first inhibiting layer $330_0$, the second inhibiting layer $330_1$, and the conductive layer 324. The dielectric layer 326 includes an oxide compound. In one embodiment, the dielectric layer 326 is a thin film dielectric. In one embodiment, the oxide compound includes ditantalum pentaoxide. In another embodiment, the dielectric layer 326 includes a thin film of a high permittivity insulator material. In another embodiment, the dielectric layer 326 includes an amorphous insulator layer. The dielectric layer 326 may be formed by any method, such as collimated sputtering, chemical vapor deposition (CVD), or other deposition techniques.

After the formation of the dielectric layer 326, in one embodiment, the dielectric layer 326 undergoes an act of crystallizing to form crystallized $Ta_2O_5$. The act of crystallizing to form crystallized $Ta_2O_5$ converts a trace amount of ruthenium that may remain from the formation of the conductive layer 324. Such conversion includes converting the trace amount of ruthenium into ruthenium dioxide. In one embodiment, the act of crystallizing occurs at a temperature of about 800 degrees Celsius. In another embodiment, the act of crystallizing occurs in an ambient of dinitrogen oxide. In another embodiment, the act of crystallizing occurs in an ambient of oxygen.

In one embodiment, the act of crystallizing forms a crystallized $Ta_2O_5$ with a desired lattice plane such that the permittivity of the crystallized $Ta_2O_5$ is greater than about 25. The desired lattice plane includes substantially a (001) lattice plane.

Figure 3I:
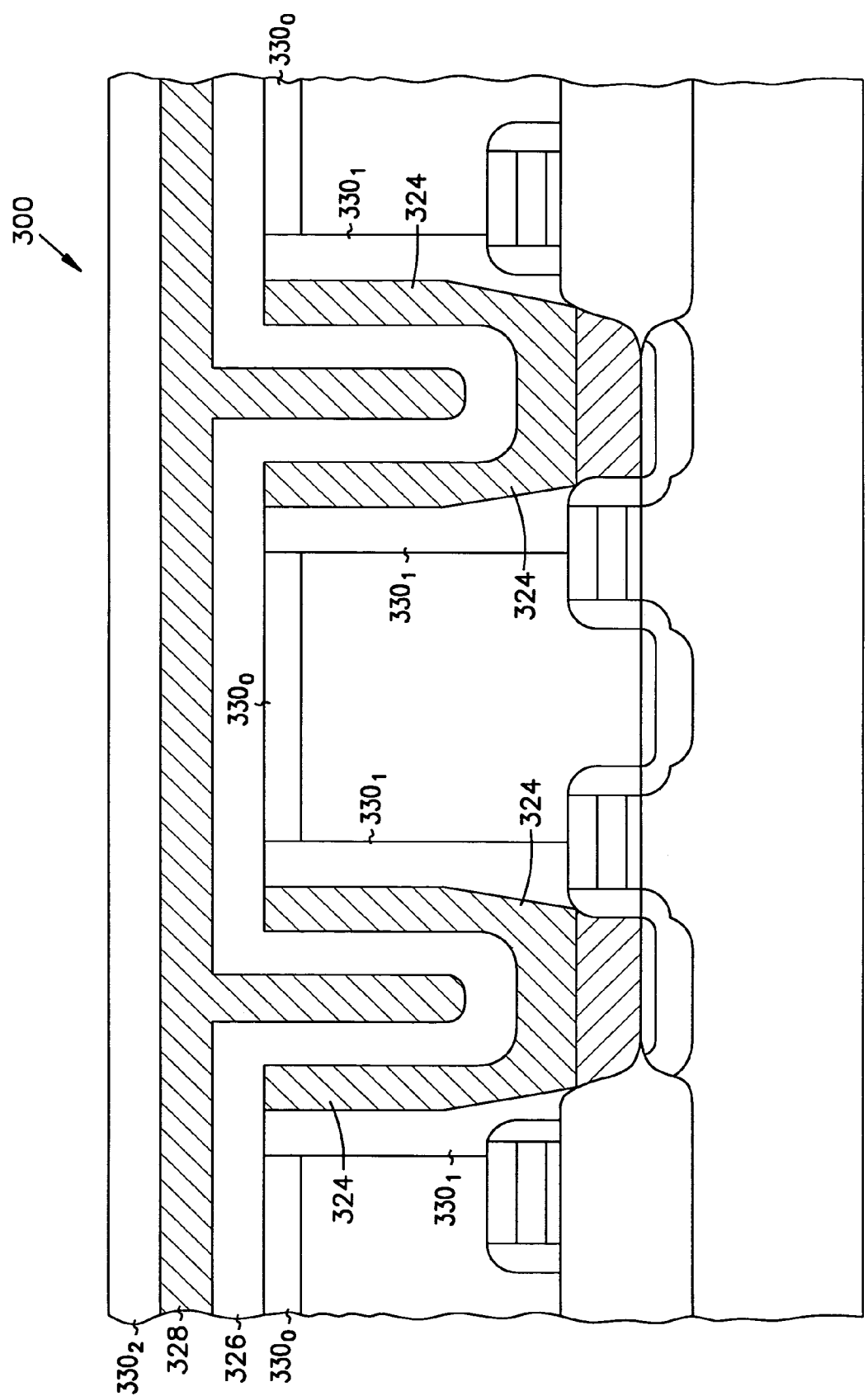

FIG. 3I shows the semiconductor structure following the next sequence of processing. A conductive layer 328 is formed on the dielectric layer 326. The conductive layer 328 includes a conductive material. The conductive layer 328 may be formed by any method, such as collimated sputtering, chemical vapor deposition (CVD), or other deposition techniques. In this embodiment, the conductive layer 328 forms the top conductive layer, or top electrode, or top plate of a semiconductor structure of interest, such as a capacitor.

A third inhibiting layer $330_2$ is optionally formed on the conductive layer 328. The third inhibiting layer $330_2$ includes a nitride compound. In one embodiment, the third inhibiting layer $330_2$ includes a metal nitride compound. The nitride compound includes a substance with a molecular formula of $Si_xN_y$. The variables x and y are indicative of the desired number of atoms. The third inhibiting layer $330_2$ may be formed by any method, such as collimated sputtering, chemical vapor deposition (CVD), or other deposition techniques.

Figure 3J:
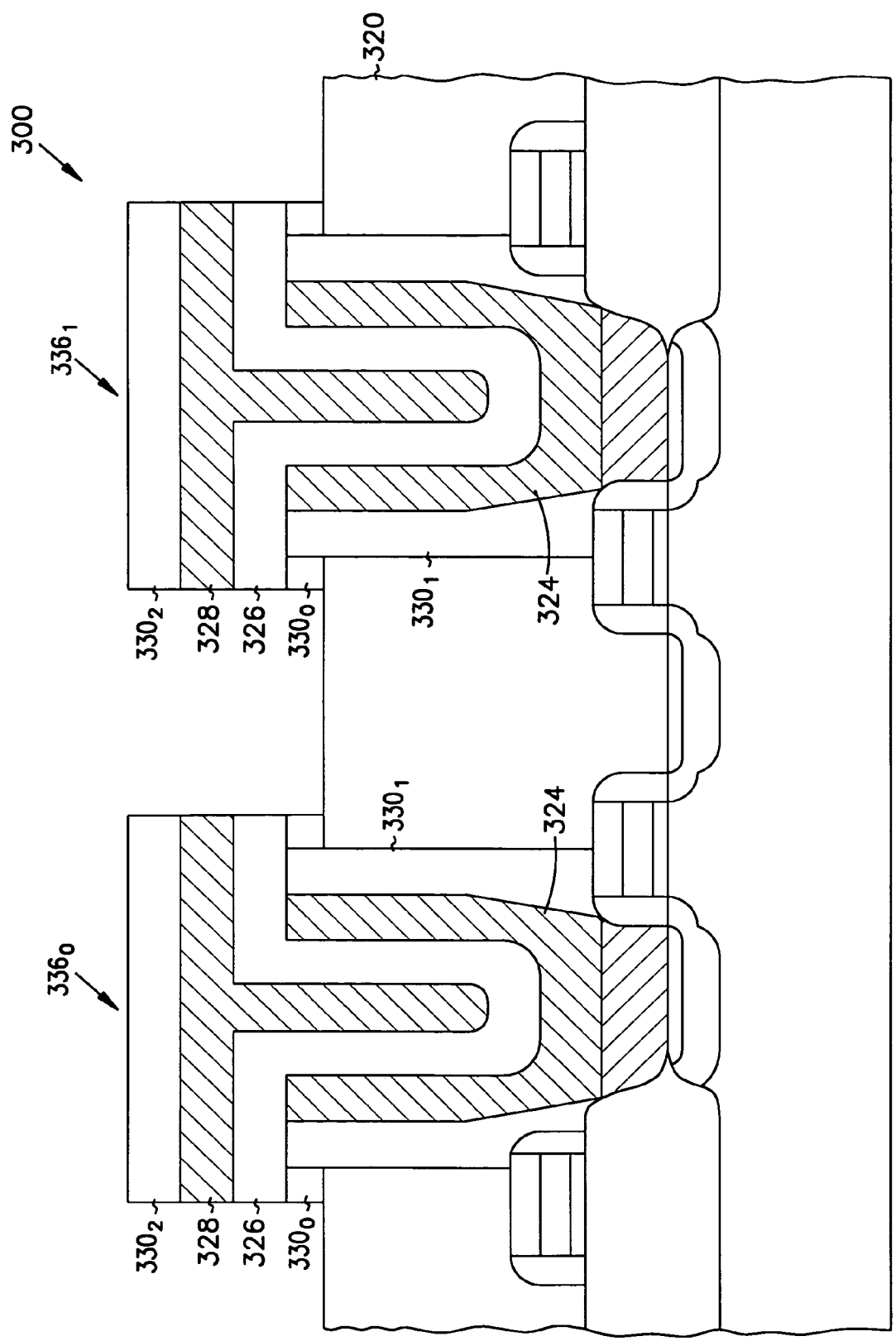

FIG. 3J shows the semiconductor structure following the next sequence of processing. The semiconductor structure 300 is patterned using photolithography with appropriately placed masks to define a number of capacitors to be used in memory cells. Then portions of the first inhibiting layer $330_0$, the dielectric layer 326, the conductive layer 328, and the second inhibiting layer $330_2$ are exposed and removed along with the masks. Those of the first inhibiting layer $330_0$, the dielectric layer 326, the conductive layer 328, and the second inhibiting layer $330_2$ may be removed by etching or other suitable removal techniques known in the art. Removal techniques are generally dependent on the material of construction of the layer to be removed as well as the surrounding layers to be retained. Patterning of the first inhibiting layer $330_0$, the dielectric layer 326, the conductive layer 328, and the second inhibiting layer $330_2$ defines two edges or terminals for each capacitor $336_0$ and $336_1$. These edges are the result of etching the various portions of the semiconductor structure 300 down to the insulation layer 320.

Figure 3K:
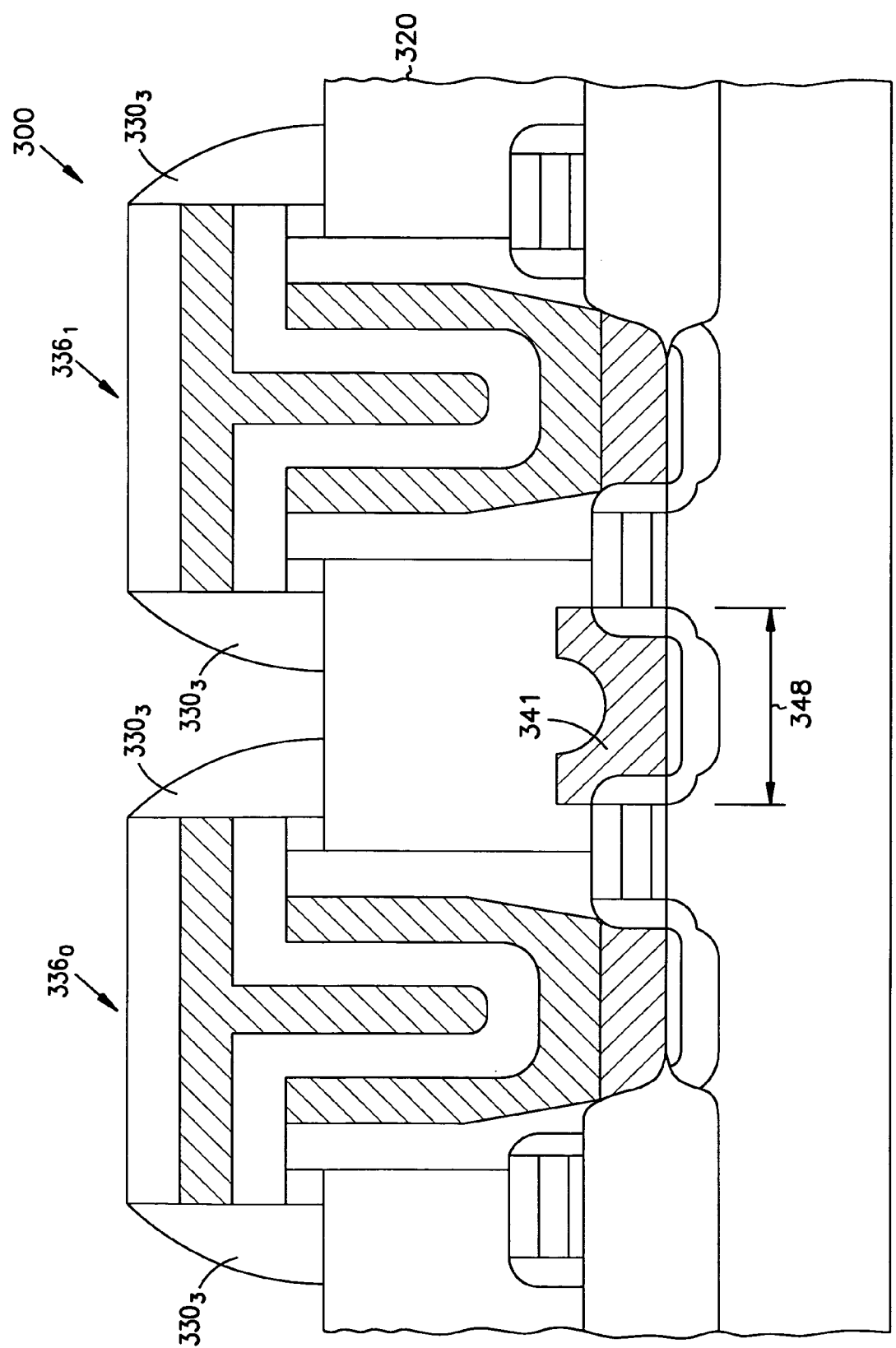

FIG. 3K shows the semiconductor structure following the next sequence of processing. A fourth inhibiting layer $330_3$ is optionally formed on the insulator layer 320 and the capacitors $336_0$ and $336_1$. The fourth inhibiting layer $330_3$ includes a nitride compound. In one embodiment, the fourth inhibiting layer $330_3$ includes a metal nitride compound. The nitride compound includes a substance with a molecular formula of $Si_xN_y$. The variables x and y are indicative of the desired number of atoms. The fourth inhibiting layer $330_3$ may be formed by any method, such as collimated sputtering, chemical vapor deposition (CVD), or other deposition techniques. Once the fourth inhibiting layer $330_3$ is formed, a portion of the fourth inhibiting layer $330_3$ is removed using a suitable technique, such as reactive ion etching. Such etching defines sidewall spacers as shown in FIG. 3J.

A digit line contact 341 is formed over the digit line contact regions 348. The formation of the digit line contact 341 and the completion of the semiconductor structure 300 do not limit the embodiments of the present invention and as such will not be discussed here in detail.

Figure 4:
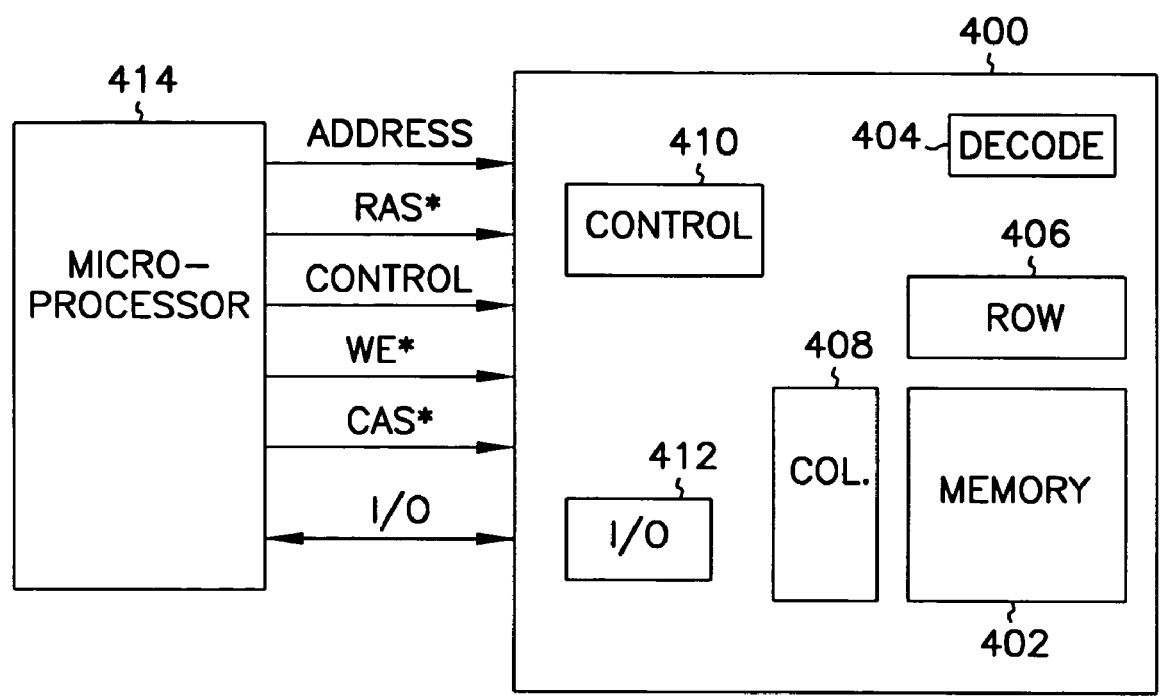
FIG. 4 is a block diagram of a device according to one embodiment of the present invention.

FIG. 4 is a block diagram of a device according to one embodiment of the present invention. The memory device 400 includes an array of memory cells 402, address decoder 404, row access circuitry 406, column access circuitry 408, control circuitry 410, and input/output circuit 412. The memory device 400 can be coupled to an external microprocessor 414, or memory controller for memory accessing. The memory device 400 receives control signals from the processor 414, such as WE*, RAS*, and CAS* signals. The memory device 400 is used to store data which is accessed via I/O lines. It will be appreciated by those skilled in the art that additional circuitry and control signals can be provided, and that the memory device 400 has been simplified to help focus on the invention. At least one of the memory cells includes a semiconductor structure in accordance with the aforementioned embodiments.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Figure 5:
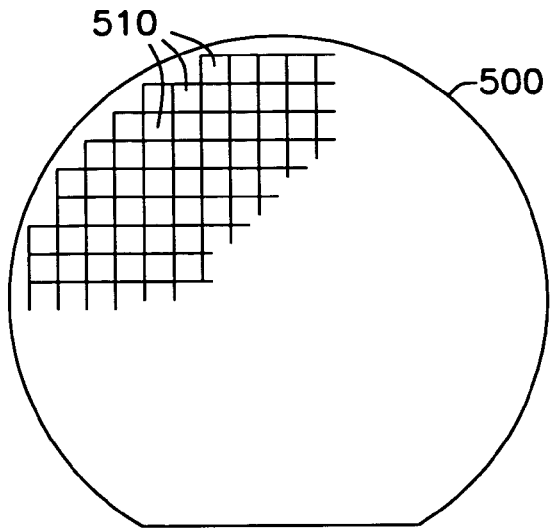
FIG. 5 is an elevation view of a semiconductor wafer according to one embodiment of the present invention.

FIG. 5 is an elevation view of a semiconductor wafer according to one embodiment of the present invention. In one embodiment, a semiconductor die 510 is produced from a wafer 500. A die is an individual pattern, typically rectangular, on a substrate that contains circuitry, or integrated circuit devices, to perform a specific function. At least one of the integrated circuit devices includes a memory cell that includes a semiconductor structure as discussed in the various embodiments heretofore in accordance with the invention. A semiconductor wafer will typically contain a repeated pattern of such dies containing the same functionality. Die 510 may contain circuitry for the inventive memory device, as discussed above. Die 510 may further contain additional circuitry to extend to such complex devices as a monolithic processor with multiple functionality. Die 510 is typically packaged in a protective casing (not shown) with leads extending therefrom (not shown) providing access to the circuitry of the die for unilateral or bilateral communication and control.

Figure 6:
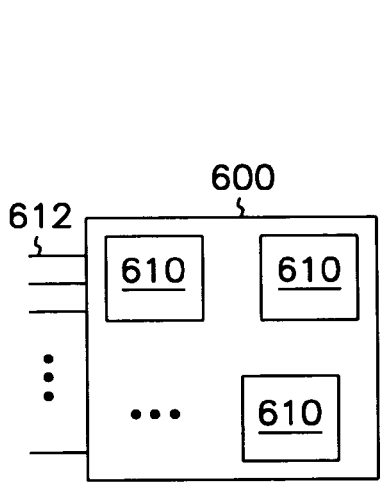
FIG. 6 is a block diagram of a circuit module according to one embodiment of the present invention.

FIG. 6 is a block diagram of a circuit module according to one embodiment of the present invention. Two or more dies 610 may be combined, with or without protective casing, into a circuit module 600 to enhance or extend the functionality of an individual die 610. Circuit module 600 may be a combination of dies 610 representing a variety of functions, or a combination of dies 610 containing the same functionality. One or more dies 610 of circuit module 600 contain at least one semiconductor structure in accordance with the embodiments of the present invention.

Some examples of a circuit module include memory modules, device drivers, power modules, communication modems, processor modules, and application-specific modules, and may include multilayer, multichip modules. Circuit module 600 may be a subcomponent of a variety of electronic systems, such as a clock, a television, a cell phone, a personal computer, an automobile, an industrial control system, an aircraft, and others. Circuit module 600 will have a variety of leads 612 extending therefrom and coupled to the dies 610 providing unilateral or bilateral communication and control.

Figure 7:
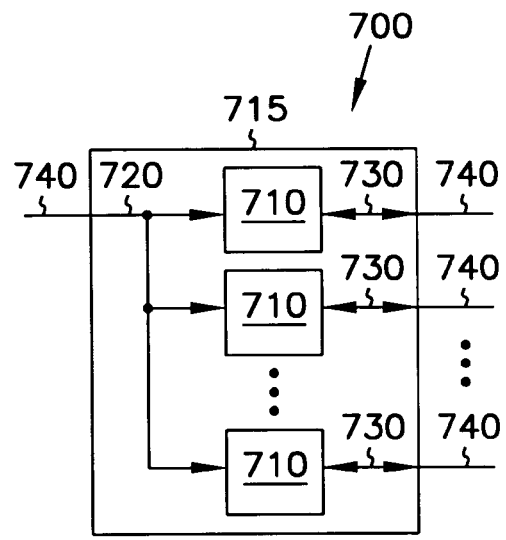
FIG. 7 is a block diagram of a memory module according to one embodiment of the present invention.

FIG. 7 is a block diagram of a memory module according to one embodiment of the present invention. Memory module 700 contains multiple memory devices 710 contained on support 715, the number depending upon the desired bus width and the desire for parity. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions as shown. At least one of the memory devices 710 includes a memory cell that includes a semiconductor structure as discussed in various embodiments in accordance with the invention.

Figure 8:
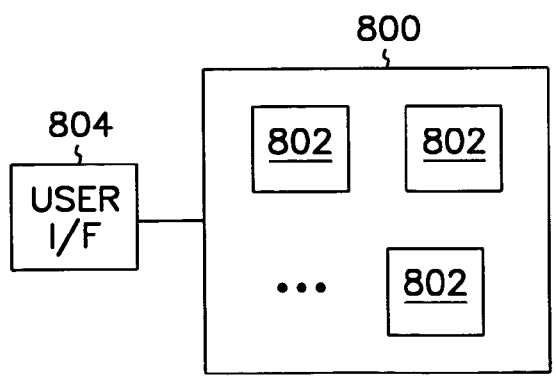
FIG. 8 is a block diagram of a system according to one embodiment of the present invention.

FIG. 8 is a block diagram of a system according to one embodiment of the present invention. Electronic system 800 contains one or more circuit modules 802. Electronic system 800 generally contains a user interface 804. User interface 804 provides a user of the electronic system 800 with some form of control or observation of the results of the electronic system 800. Some examples of user interface 804 include the keyboard, pointing device, monitor, or printer of a personal computer; the tuning dial, display, or speakers of a radio; the ignition switch, gauges, or gas pedal of an automobile; and the card reader, keypad, display, or currency dispenser of an automated teller machine. User interface 804 may further describe access ports provided to electronic system 800. Access ports are used to connect an electronic system to the more tangible user interface components previously exemplified. One or more of the circuit modules 802 may be a processor providing some form of manipulation, control, or direction of inputs from or outputs to user interface 804, or of other information either preprogrammed into, or otherwise provided to, electronic system 800. As will be apparent from the lists of examples previously given, electronic system 800 will often contain certain mechanical components (not shown) in addition to circuit modules 802 and user interface 804. It will be appreciated that the one or more circuit modules 802 in electronic system 800 can be replaced by a single integrated circuit. Furthermore, electronic system 800 may be a subcomponent of a larger electronic system. At least one of the circuit modules 802 includes a memory cell that includes a semiconductor structure as discussed in various embodiments in accordance with the invention.

Figure 9:
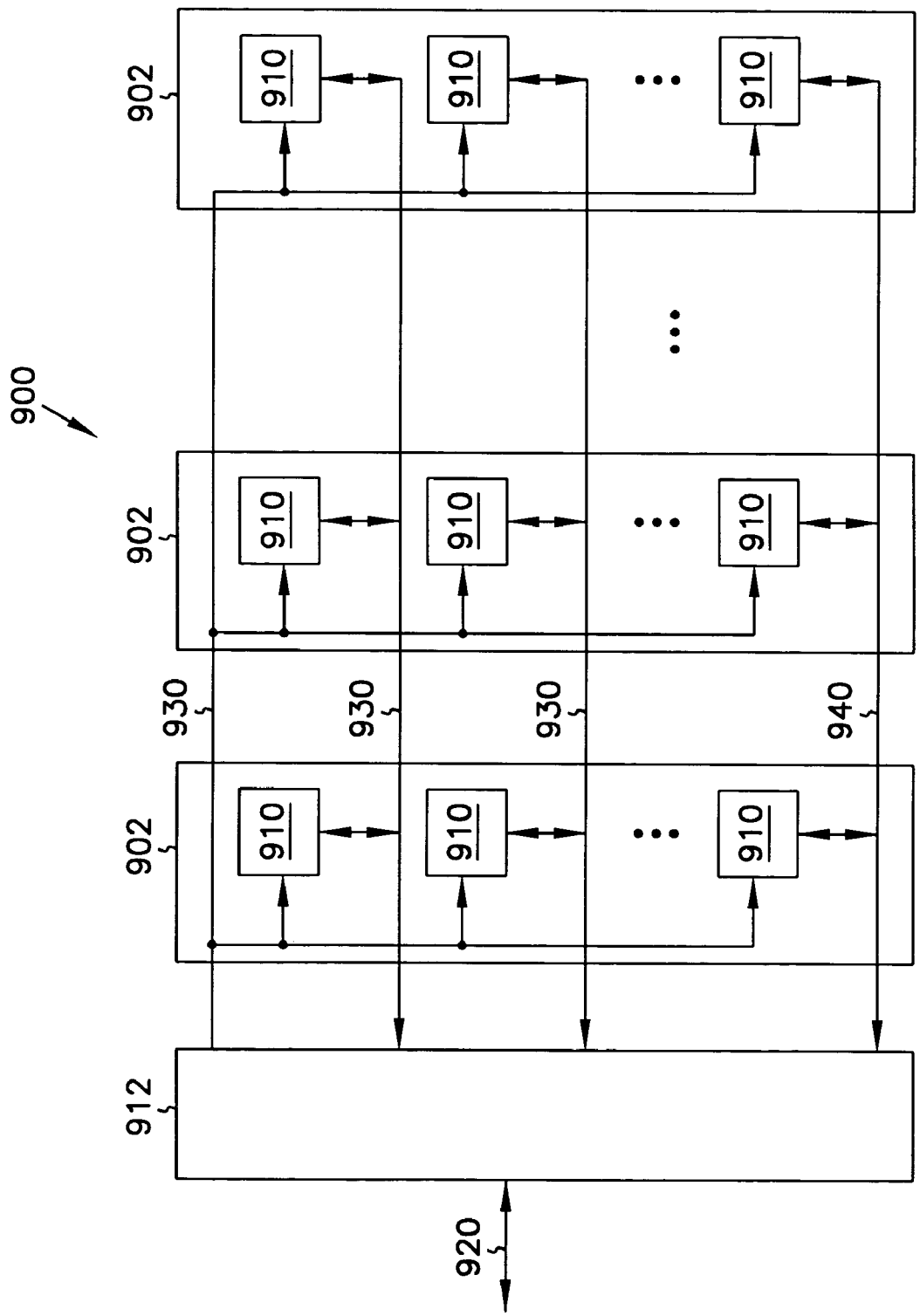
FIG. 9 is a block diagram of a system according to one embodiment of the present invention.

FIG. 9 is a block diagram of a system according to one embodiment of the present invention. Memory system 900 contains one or more memory modules 902 and a memory controller 912. Each memory module 902 includes at least one memory device 910. Memory controller 912 provides and controls a bidirectional interface between memory system 900 and an external system bus 920. Memory system 900 accepts a command signal from the external bus 920 and relays it to the one or more memory modules 902 on a command link 930. Memory system 900 provides for data input and data output between the one or more memory modules 902 and external system bus 920 on data links 940. At least one of the memory devices 910 includes a memory cell that includes a semiconductor structure as discussed in various embodiments in accordance with the invention.

Figure 10:
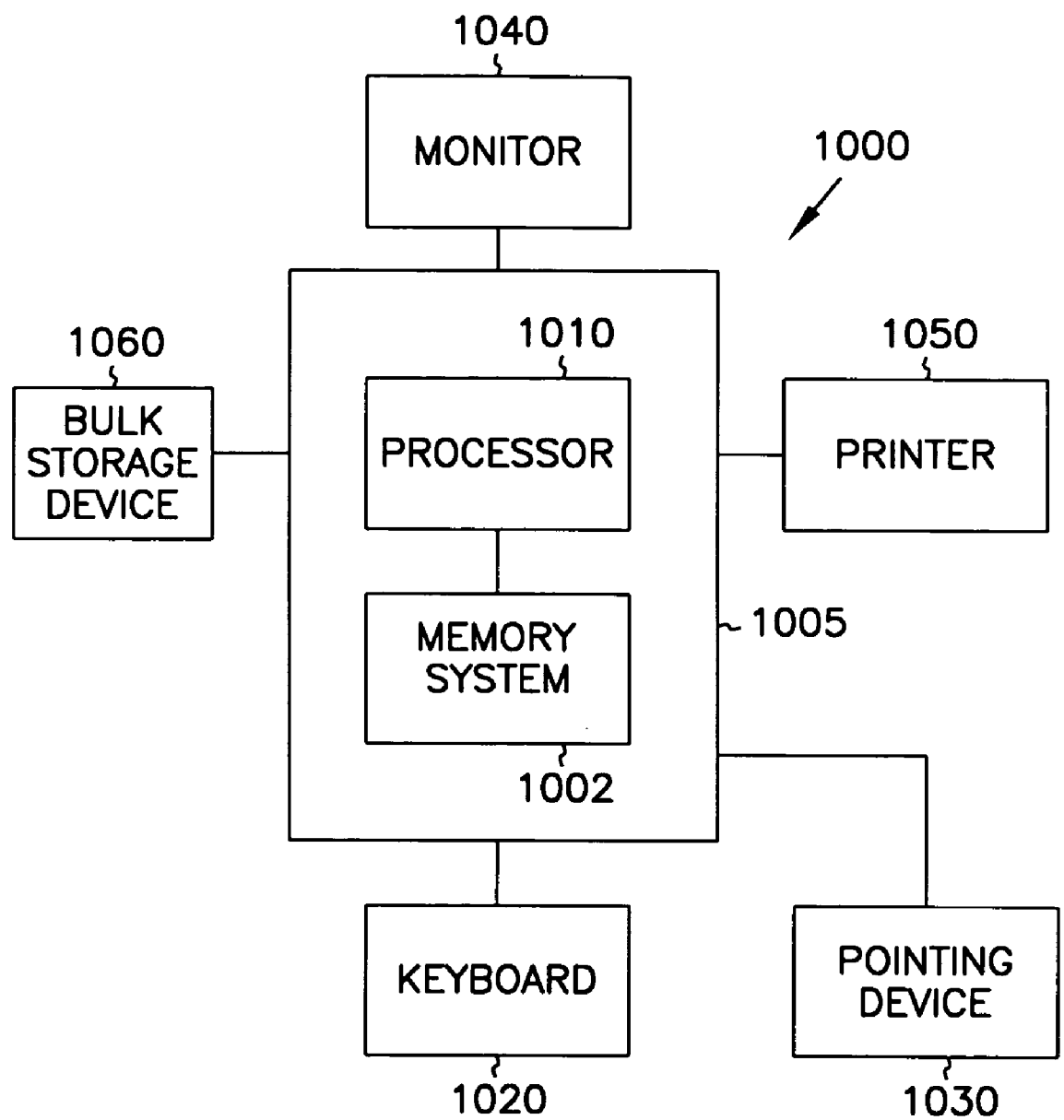
FIG. 10 is a block diagram of a system according to one embodiment of the present invention.

FIG. 10 is a block diagram of a system according to one embodiment of the present invention. Computer system 1000 contains a processor 1010 and a memory system 1002 housed in a computer unit 1005. Computer system 1000 is but one example of an electronic system containing another electronic system, e.g., memory system 1002, as a subcomponent. The memory system 1002 may include a memory cell that includes a semiconductor structure as discussed in various embodiments of the present invention. Computer system 1000 optionally contains user interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory circuit.

CONCLUSION

Systems, devices, structures, and methods have been described to address situations where, at high temperature, undesired diffusion acts against a high permittivity dielectric in a capacitor such that degradation occurs. Capacitors that are formed using at least one technique as described heretofore benefit from the dual ability of having an increase in storage capability yet maintain reliability in the process of manufacturing involving high temperatures.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

We claim:

1. A method for enhancing a dielectric, comprising:
    forming an as-deposited film of a conductive compound that includes a first substance and a second substance, wherein the act of forming incorporates a substantial amount of the second substance in the as-deposited film so as to inhibit undesired oxidation of the first substance at a high temperature;
    crystallizing the as-deposited film to form ruthenium dioxide and a trace amount of ruthenium; and
    forming the dielectric over the conductive compound.

2. The method of claim 1, wherein the first substance includes ruthenium.

3. The method of claim 1, wherein the second substance includes oxygen.

4. The method of claim 1, wherein the conductive compound includes $RuO_x$, wherein the x is indicative of a desired number of atoms.

5. The method of claim 1, wherein the dielectric includes ditantalum pentaoxide.

6. A method for enhancing a semiconductor structure that stores charges, comprising:
    forming an as-deposited film of a conductive compound that includes a first substance and a substantial amount of a second substance so as to inhibit volatile oxide states caused by the first substance;

crystallizing the as-deposited film to form ruthenium dioxide and a trace amount of ruthenium; and forming a dielectric over the conductive compound.

7. The method of claim 6, wherein forming the as-deposited film includes forming in about 210 degrees Celsius.

8. The method of claim 6, wherein forming the as-deposited film includes forming with a first substance, wherein the first substance includes about 200 sccm of Ru-HEC.

9. The method of claim 6, wherein forming the as-deposited film includes forming with a second substance, wherein the second substance includes about 250 sccm of $O_2$.

10. The method of claim 6, wherein forming the as-deposited film includes forming at a pressure of about 2.5 torrs.

11. A method for enhancing a semiconductor structure that stores charges, comprising:

forming an as-deposited film of ruthenium and oxygen that includes a substantial amount of oxygen so as to inhibit morphological change caused by oxidation of ruthenium;

crystallizing the as-deposited film to form a crystallized film of ruthenium dioxide and a trace amount of ruthenium; and forming a dielectric over the crystallized film.

12. The method of claim 11, wherein crystallizing includes crystallizing at a temperature that is greater than about 750 degrees Celsius and less than about 800 degrees Celsius.

13. The method of claim 11, wherein crystallizing includes crystallizing in an ambient of nitrogen.

14. The method of claim 11, wherein forming the as-deposited film includes depositing the as-deposited film using a technique of chemical vapor deposition.

15. A method for enhancing a semiconductor structure that stores charges, comprising:

forming an as-deposited film of ruthenium oxide that includes a substantial amount of oxygen so as to inhibit morphological change caused by oxidation of ruthenium;

crystallizing the as-deposited film to form a crystallized film, wherein the act of crystallizing results in compounds and substances that include ruthenium dioxide and a trace amount of ruthenium; and forming a dielectric over the crystallized film.

16. A method for enhancing a semiconductor structure that stores charges, comprising:

forming a conductive layer of $RuO_x$;

crystallizing to form $RuO_2$ and a trace amount of Ru;

forming an amorphous insulator layer of $Ta_2O_5$; and crystallizing to form crystallized $Ta_2O_5$, wherein the act of crystallizing to form crystallized $Ta_2O_5$ converts the trace amount of Ru into $RuO_2$.

17. The method of claim 16, wherein crystallizing to form crystallized $Ta_2O_5$ includes crystallizing at a temperature of about 800 degrees Celsius.

18. The method of claim 16, wherein crystallizing to form crystallized $Ta_2O_5$ includes crystallizing in an ambient of dinitrogen oxide.

19. The method of claim 16, wherein crystallizing to form crystallized $Ta_2O_5$ includes crystallizing in an ambient of oxygen.

20. The method of claim 16, wherein crystallizing to form crystallized $Ta_2O_5$ acts to passivate the conductive layer from volatility caused by the trace amount of Ru.

21. A method for enhancing a semiconductor structure that stores charges, comprising:

forming a conductive layer of $RuO_x$;

crystallizing to form $RuO_2$ and a trace amount of Ru;

forming an amorphous insulator layer of $Ta_2O_5$; and forming a crystallized $Ta_2O_5$ with a desired lattice plane such that the permittivity of the crystallized $Ta_2O_5$ is greater than about 25.

22. The method of claim 21, wherein forming a crystallized $Ta_2O_5$ includes forming substantially a (001) lattice plane.

23. The method of claim 21, wherein forming a conductive layer of $RuO_x$ includes forming with a substantial amount of oxygen.

24. The method of claim 21, wherein crystallizing includes crystallizing at a temperature of greater than about 750 degrees Celsius to less than about 800 degrees Celsius.

25. The method of claim 21, wherein forming a crystallized $Ta_2O_5$ includes forming at a temperature of about 800 degrees Celsius.

* * * * *

UNITED STATES PATENT AND TRADEMARK OFFICE
CERTIFICATE OF CORRECTION

PATENT NO.       : 7,232,721 B2                                Page 1 of 1
APPLICATION NO.  : 10/931396
DATED            : June 19, 2007
INVENTOR(S)      : Basceri et al.

It is certified that error appears in the above-identified patent and that said Letters Patent is hereby corrected as shown below:

In column 1, line 6, delete "09,598,355" and insert -- 09/598,355 --, therefor.

In column 7, line 50, delete "330," and insert -- $330_1$ --, therefor.

In column 7, line 55, delete "330," and insert -- $330_1$ --, therefor.

In column 14, line 13, in Claim 17, delete "$Ta_2O_5$includes" and insert -- $Ta_2O_5$ includes --, therefor.

In column 14, line 16 (Approx.), in Claim 18, delete "$Ta_2O_5$includes" and insert -- $Ta_2O_5$ includes --, therefor.

In column 14, line 19 (Approx.), in Claim 19, delete "$Ta_2O_5$includes" and insert -- $Ta_2O_5$ includes --, therefor.

In column 14, line 37, in Claim 23, delete "$RuO_x$includes" and insert -- $RuO_x$ includes --, therefor.

Signed and Sealed this

Seventh Day of August, 2007

JON W. DUDAS
*Director of the United States Patent and Trademark Office*